United States Patent
Wang

(10) Patent No.: US 9,632,636 B2
(45) Date of Patent: Apr. 25, 2017

(54) MANUFACTURE METHOD OF TOUCH PANEL

(71) Applicant: Shenzhen China Star Optoelectronics Technology Co., Ltd., Shenzhen, Guangdong (CN)

(72) Inventor: Jun Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 98 days.

(21) Appl. No.: 14/430,199

(22) PCT Filed: Sep. 11, 2014

(86) PCT No.: PCT/CN2014/086261
§ 371 (c)(1),
(2) Date: Mar. 20, 2015

(87) PCT Pub. No.: WO2016/026180
PCT Pub. Date: Feb. 25, 2016

(65) Prior Publication Data
US 2016/0246402 A1    Aug. 25, 2016

(30) Foreign Application Priority Data
Aug. 20, 2014  (CN) .......................... 2014 1 0415826

(51) Int. Cl.
*C30B 33/00* (2006.01)
*G06F 3/044* (2006.01)
(Continued)

(52) U.S. Cl.
CPC ............ *G06F 3/044* (2013.01); *C23C 14/086* (2013.01); *C23C 14/35* (2013.01); *C23C 16/44* (2013.01);
(Continued)

(58) Field of Classification Search
CPC ........... G02F 1/13394; G02F 1/133514; G02F 1/1368; G02F 1/133512; G02F 1/13339; G06F 3/0416; G06F 3/0412; C23C 14/08
(Continued)

(56) References Cited

U.S. PATENT DOCUMENTS

2006/0223205 A1*  10/2006  Jacobs .................... H01L 24/95
                                                       438/22
2007/0002219 A1*  1/2007  Lee ..................... G02F 1/13394
                                                       349/106
(Continued)

FOREIGN PATENT DOCUMENTS

| CN | 103336620 A | 10/2013 |
|----|-------------|---------|
| CN | 103792711 A | 5/2014  |
| CN | 103927045 A | 7/2014  |

*Primary Examiner* — Lan Vinh
(74) *Attorney, Agent, or Firm* — Andrew C. Cheng

(57) ABSTRACT

The present invention provides a manufacture method of a touch panel, comprising: step 1, forming a black matrix (2) on one side (11) of a color filter substrate (1); the black matrix (2) is positioned corresponding to a sensor pattern to be set to form gaps at portions of the black matrix (2) corresponding to the sensor pattern to be set; step 2, depositing a conductive film (3) on the other side (13) of the color filter substrate (1); step 3, coating photoresistor (4) on the conductive film (3); step 4, employing the black matrix (2) as a mask to implement exposure process and development process to the photoresistor (4) from the one side (11) of the color filter substrate (1) formed with the black matrix (2); step 5, implementing etching to the conductive film (3) by utilizing the photoresistor (4') remained after the development to obtain the sensor pattern (3') to be set; step 6, forming a protective layer (5) on the color filter substrate (1) and the sensor pattern (3'). The method saves manufacture times and the cost is low.

9 Claims, 5 Drawing Sheets

(51) Int. Cl.
| | |
|---|---|
| *C23C 14/08* | (2006.01) |
| *C23C 14/35* | (2006.01) |
| *C23C 16/44* | (2006.01) |
| *C23F 1/00* | (2006.01) |
| *G02F 1/1333* | (2006.01) |
| *G06F 3/041* | (2006.01) |

(52) U.S. Cl.
CPC ............ *C23F 1/00* (2013.01); *G02F 1/13338* (2013.01); *G06F 3/0412* (2013.01); *G06F 2203/04103* (2013.01)

(58) Field of Classification Search
USPC .......................... 216/24, 25, 26, 41, 78, 81
See application file for complete search history.

(56) References Cited

U.S. PATENT DOCUMENTS

2014/0313442 A1* 10/2014 Misaki .................... G06F 3/041
  349/12
2015/0370115 A1* 12/2015 Ge ........................ G02F 1/1368
  349/43

* cited by examiner

MANUFACTURE METHOD OF TOUCH PANEL

FIELD OF THE INVENTION

The present invention relates to a display technology field, and more particularly to a manufacture method of a touch panel.

BACKGROUND OF THE INVENTION

A Touch Panel (TP), also named touch control screen or touch control panel as being an input device of human machine interface has been widely utilized in kinds of electronic apparatuses, such as cell phones, PDAs, multimedia, public information query systems and et cetera. A user can touch the screen with fingers or a stylus to generate variations of electrical signals. The recognizing or selecting operations can be proceeded to the words, symbols, menus and et cetera shown in the display behind the touch panel to realize the input operation to the devices.

At present, a capacitive touch panel is the most widely utilized touch panel. The working principle is that the user and the surface of the touch panel form a coupling capacitor due to the body electric field when the fingers touch the panel. For a high frequency current, the capacitor is a direct conductor. Therefore, the finger extracts a tiny small current from the contact point. The detection circuit detects the variations of this tiny small current for confirmation of the finger's position.

In prior arts, the capacitive touch panel is generally manufactured by forming a conductive film on a tempered glass. Then, a mask, i.e. a photomask is employed to implement processes of exposure, etching and et cetera to the conductive film. However, the manufacture cost of the mask is relatively higher. The tempered glass has to be shaped as a small piece to be assembled in a carrier. The alignment between the mask and the carrier is performed by focusing or snapping the alignment mark on the entire carrier for implementing the exposure. Because the size of the glass substrate is smaller than the carrier and the exposure error can be larger. The mass production can be difficult. Besides, it is demanded to implement processes of coating, soft baking, hard baking, exposure, development, etching, photoresistor stripping and et cetera to the photoresistor. Lots of process times can be indispensable. Therefore, the efficiency of the production is lower and the manufacture cost can be higher.

In a Thin Film Transistor Liquid Crystal Display (TFT-LCD), the touch system of the capacitive touch panel can be designed to have the embedded structure. Accordingly, the touch panel and the display can be integrated together. In some degree, the thickness of the whole liquid crystal display can be reduced and the manufacture process can be simplified. For a Thin Film Transistor Liquid Crystal Display, the display panel generally comprises a TFT array substrate, a Color Filter (CF) laminated with the TFT array substrate and a liquid crystal layer sandwiched inbetween. Because more circuit is arranged on the TFT substrate, commonly, the embedded capacitive touch panel is arranged on the color filter substrate side.

In the manufacture procedure of the color filter substrate, Formation of a Black Matrix (BM) is essential to prevent the light leakage from the gaps among the sub pixels of three primary colors, red, green and blue. Please refer to FIG. 1, a traditional black matrix 100 comprises a plurality of rows 101 and columns 103 which are orthogonally connected to form a unity array structure. The traditional black matrix 100 merely has shielding function.

SUMMARY OF THE INVENTION

An objective of the present invention is to provide a manufacture method of a touch panel to simplify the process, reduce the amount of masks, save the manufacture times, raise the production efficiency and decrease the manufacture cost. Meanwhile, the alignment accuracy is promoted to effectively prevent the problems of Moiré happening.

For realizing the aforesaid objective, the present invention provides a manufacture method of a touch panel, comprising steps of:

step 1, forming a black matrix on one side of a color filter substrate;

the black matrix is positioned corresponding to a sensor pattern to be set to form gaps at portions of the black matrix corresponding to the sensor pattern to be set;

step 2, deposing a conductive film on the other side of the color filter substrate;

step 3, coating photoresistor on the conductive film;

step 4, employing the black matrix formed in the step 1 as a mask to implement exposure process to the photoresistor formed in the step 3 from the one side of the color filter substrate formed with the black matrix and then implementing development process;

step 5, implementing etching to the conductive film by utilizing the photoresistor remained after the development in the step 4 to obtain the sensor pattern to be set;

step 6, implementing film formation on the color filter substrate and the sensor pattern to form a protective layer for accomplishing the manufacture of a touch panel sensor.

The black matrix comprises rows and columns, and the rows and the columns are orthogonally connected.

The gaps are set at positions where the rows and the columns are connected.

In the step 2, the conductive film is an Indium Titanium Oxide thin film or a metal thin film.

In the step 2, the conductive film is formed by magnetron sputtering or chemical vaporous deposition.

In the step 4, an ultraviolet light of wavelength 200 nm-450 nm is employed to implement the exposure process to the photoresistor.

In the step 4, the exposure lasts with 20-180 seconds.

In the step 6, the protective layer is a silicon nitride thin film or a silicon dioxide thin film.

The benefits of the present invention are: by forming the black matrix on the one side of the color filter substrate, and employing the black matrix as the mask to implement exposure process to the photoresistor and to etch the conductive film for forming the sensor pattern, the manufacture method of the touch panel provided by the present invention is a method of manufacturing a touch panel without using a special mask. The method can simplify the process, reduce the amount of masks, save the manufacture times, raise the production efficiency and decrease the manufacture cost. Meanwhile, the black matrix as the mask can achieve the self-alignment, and then the alignment accuracy is promoted to effectively prevent the problems of Moiré happening.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Figure 1:
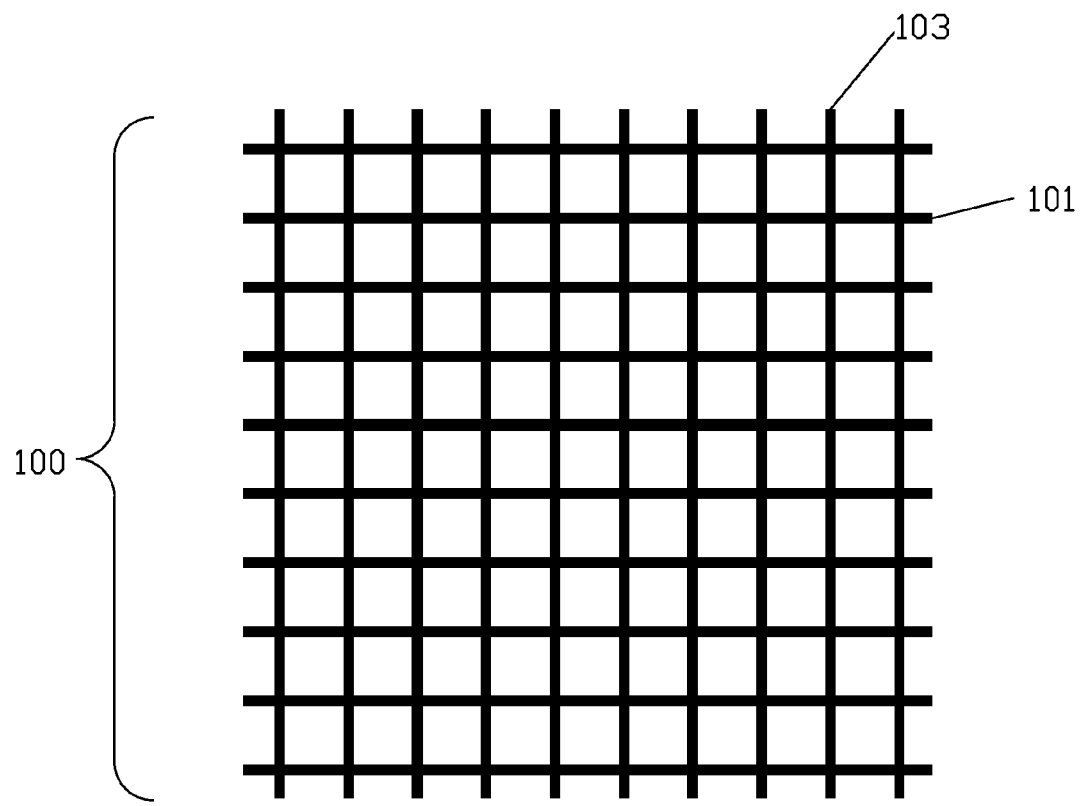
FIG. 1 is a front view diagram of a traditional black matrix according to prior art.
Figure 2:
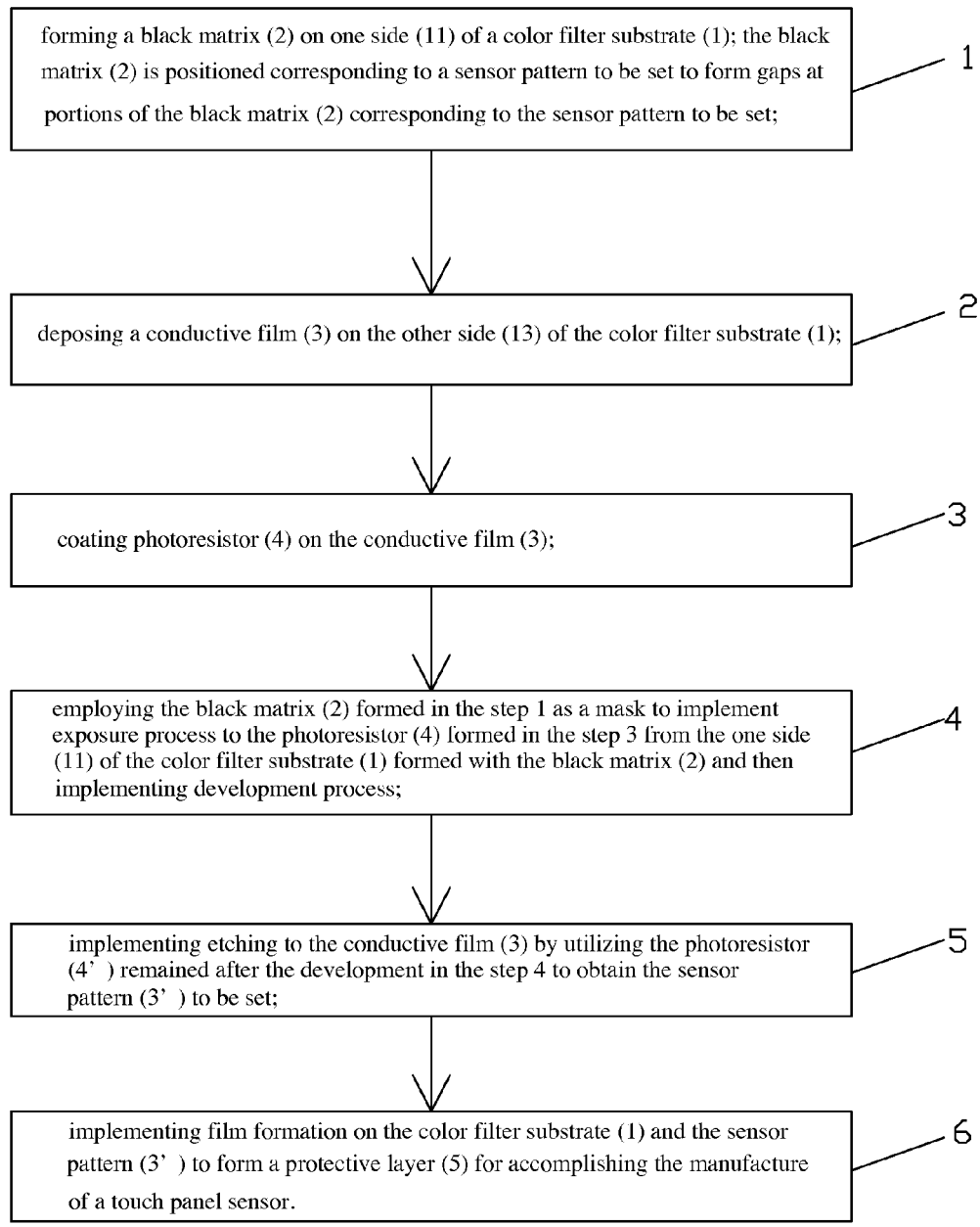
FIG. 2 is a flowchart of a manufacture method of a touch panel according to the present invention.
Figure 3:
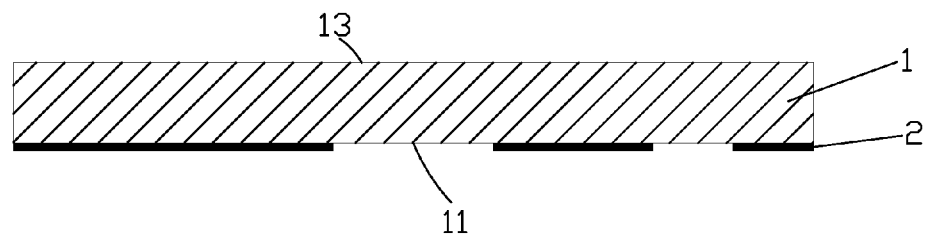
FIG. 3 is a sectional diagram of step 1 of the manufacture method of the touch panel according to the present invention.
Figure 4:
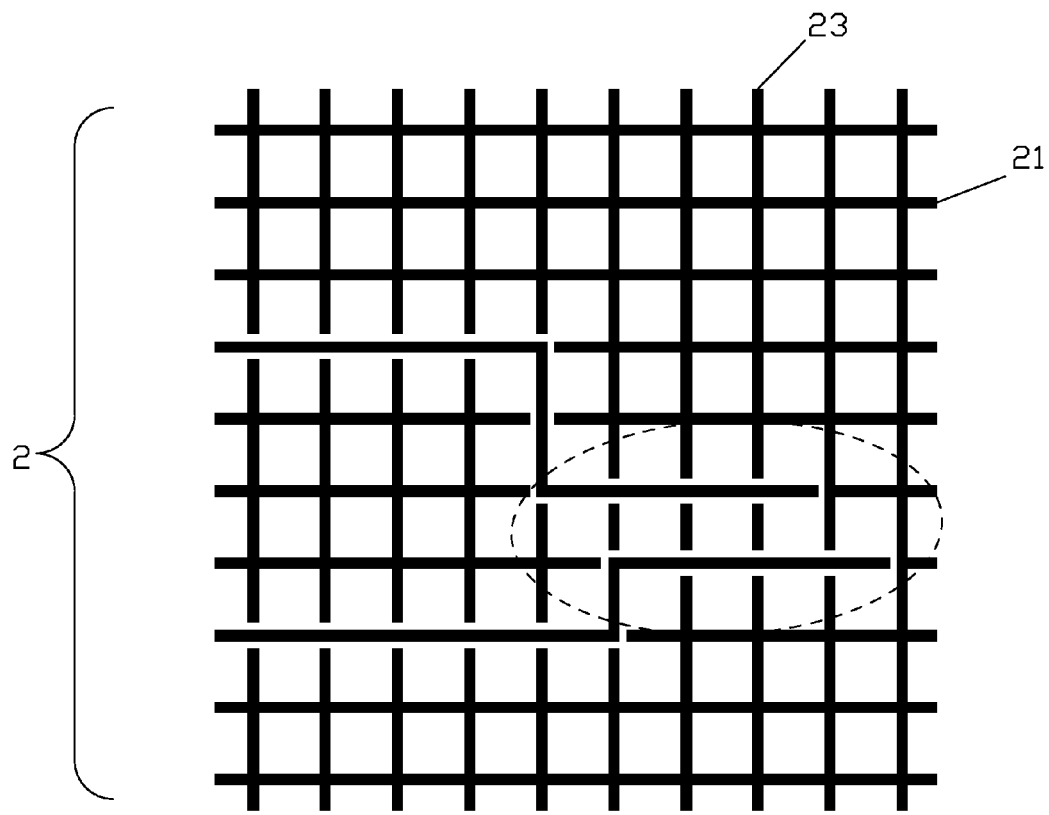
FIG. 4 is a front view diagram of a black matrix in the step 1 of the manufacture method of the touch panel according to the present invention.

Please refer to FIG. 2. The present invention provides a manufacture method of a touch panel. The method comprises steps of:

step 1, please refer to FIG. 3, FIG. 4, forming a black matrix 2 on one side 11 of a color filter substrate 1.

As shown in FIG. 4, the black matrix 2 comprises rows 21 and columns 23, and the rows 21 and the columns 23 are orthogonally connected. Specifically, the black matrix 2 is positioned corresponding to a sensor pattern to be set: for corresponding to the continuous portions of the sensor pattern to be set, the rows 21 and the columns 23 of the black matrix 2 also are formed with mutually and continuously connections; for corresponding to the disconnected positions of the sensor pattern to be set, the gaps are located at connected positions of the rows 21 and the columns 23 of the black matrix 2.

Specifically, the black matrix 2 is formed by resin polymer added with photo sensing material which is processed by a photolithographic process to create the shape corresponding to the sensor pattern to be set.

Figure 5:
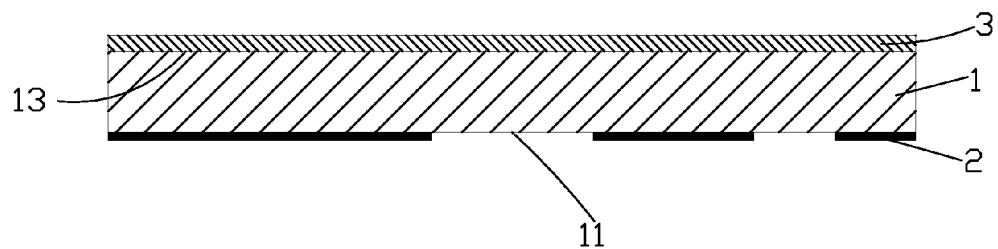
FIG. 5 is a sectional diagram of step 2 of the manufacture method of the touch panel according to the present invention.

The black matrix 2 formed in the step 1 not only functions for light shielding but also play as a mask for implementing exposure to a photoresistor in the following step 4.

step 2, please refer to FIG. 5, depositing a conductive film 3 on the other side 13 of the color filter substrate 1.

The conductive film 3 is a base of the sensor pattern to be set. The desired sensor pattern to be set can be acquired by implementing etching to the conductive film 3 according to predetermined pattern.

Figure 6:
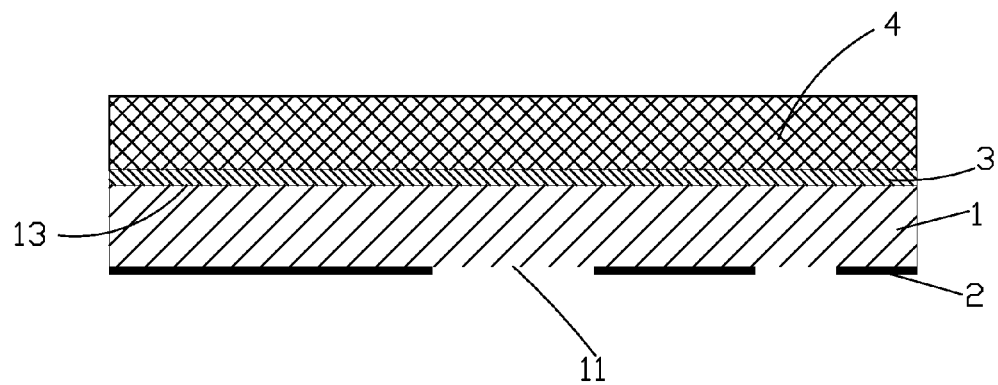
FIG. 6 is a sectional diagram of step 3 of the manufacture method of the touch panel according to the present invention.

Specifically, the conductive film 3 is an Indium Titanium Oxide (ITO) thin film or a metal thin film and can be formed by magnetron sputtering or chemical vaporous deposition.

step 3, please refer to FIG. 6, coating photoresistor 4 on the conductive film 3.

Figure 7:
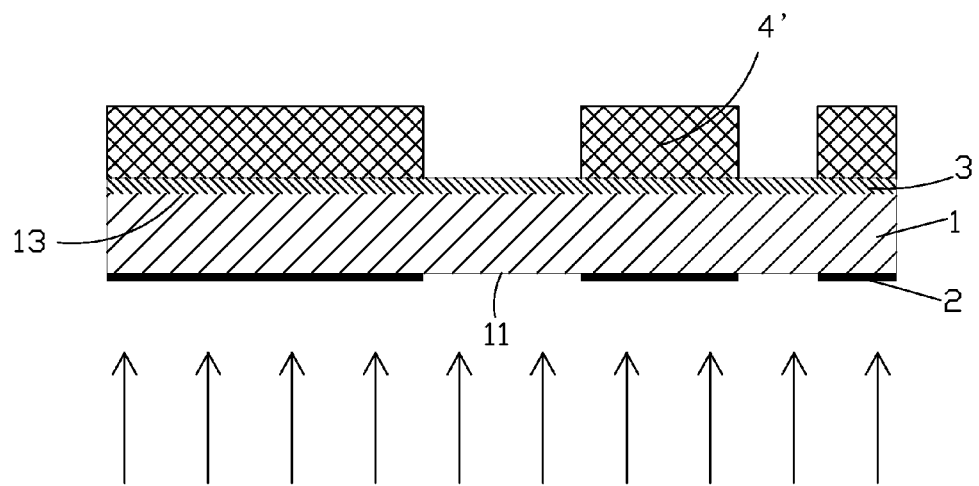
FIG. 7 is a sectional diagram of step 4 of the manufacture method of the touch panel according to the present invention.

Step 4, please refer to FIG. 7, employing the black matrix 2 formed in the step 1 as a mask to implement exposure process to the photoresistor 4 formed in the step 3 from the one side 11 of the color filter substrate 1 formed with the black matrix 2 and then implementing development process.

The difference of the step 4 from prior arts is, a special mask is located on the photoresistor in prior art, but the black matrix 2 corresponding to the sensor pattern to be set is employed as a mask. The backside exposure process is implemented to the photoresistor 4 from the one side of the color filter substrate 1 formed with black matrix 2. On one hand, the special made mask is omitted and the process is simplified to save the process time, to raise the product efficiency and to decrease the manufacture cost. On the other hand, the black matrix 2 is employed as the mask for achieving the self-alignment. The alignment accuracy is promoted to effectively prevent the problems of Moiré happening.

Specifically, an ultraviolet light of wavelength 200 nm-450 nm is employed to implement the exposure process to the photoresistor 4. The exposure time depends on the type and the thickness of the photoresistor 4 which is controlled in a range of 20-180 seconds.

Figure 8:
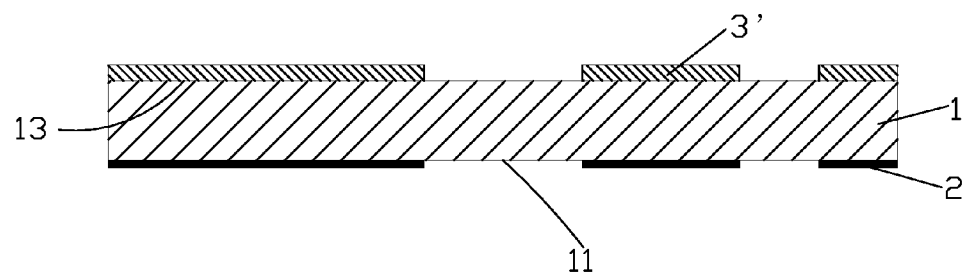
FIG. 8 is a sectional diagram of step 5 of the manufacture method of the touch panel according to the present invention.

After the exposure and the development of the step 4 is accomplished, partial photoresistor 4 corresponding to the sensor pattern is preserved to form the remained photoresistor 4'.

step 5, please refer to FIG. 8, implementing etching to the conductive film 3 by utilizing the photoresistor 4' remained after the development in the step 4 to obtain the sensor pattern 3' to be set.

Figure 9:
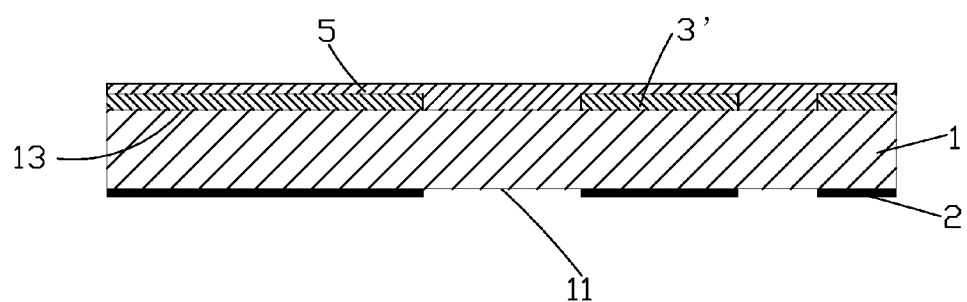
FIG. 9 is a sectional diagram of step 6 of the manufacture method of the touch panel according to the present invention.

After the etching is accomplished, a stripping process is required to remove the remained photoresistor 4'.

step 6, please refer to FIG. 9, implementing film formation on the color filter substrate 1 and the sensor pattern 3' to form a protective layer 5 for accomplishing the manufacture of a touch panel sensor.

Specifically, the protective layer 5 can be a silicon nitride thin film or a silicon dioxide thin film.

In conclusion, by forming the black matrix on the one side of the color filter substrate, and employing the black matrix as the mask to implement exposure process to the photoresistor and to etch the conductive film for forming the sensor pattern, the manufacture method of the touch panel provided by the present invention is a method of manufacturing a touch panel without using a special mask. The method can simplify the process, reduce the amount of masks, save the manufacture times, raise the production efficiency and decrease the manufacture cost. Meanwhile, the black matrix as the mask can achieve the self-alignment, and then the alignment accuracy is promoted to effectively prevent the problems of Moiré happening.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a touch panel, comprising:
    step 1, forming a black matrix on one side of a color filter substrate;
    wherein the black matrix is arranged to shield light leakage among sub pixels of different colors of the color filter substrate and the black matrix is positioned corresponding to a sensor pattern to be set to form gaps at portions of the black matrix corresponding to the sensor pattern to be set;
    step 2, deposing a conductive film on the other side of the color filter substrate such that the black matrix and the conductive film are respectively located on opposites sides of the color filter substrate;
    step 3, coating photoresistor on the conductive film;
    step 4, employing the black matrix formed in the first step as a mask to implement exposure process to the photoresistor formed in the third step from the one side of the color filter substrate formed with the black matrix and then implementing development process;
    step 5, implementing etching to the conductive film by utilizing the photoresistor remained after the development in the fourth step to obtain the sensor pattern to be set such that the sensor pattern and the black matrix are respectively located on opposite sides of the color filter substrate;
    step 6, implementing film formation on the color filter substrate and the sensor pattern to form a protective layer for accomplishing the manufacture of a touch panel sensor.

2. The manufacture method of the touch panel according to claim 1, wherein the black matrix comprises rows and columns, and the rows and the columns are orthogonally connected.

3. The manufacture method of the touch panel according to claim 2, wherein the gaps are set at positions where the rows and the columns are connected.

4. The manufacture method of the touch panel according to claim 1, wherein in the second step, the conductive film is an Indium Titanium Oxide thin film or a metal thin film.

5. The manufacture method of the touch panel according to claim 1, wherein in the second step, the conductive film is formed by magnetron sputtering or chemical vaporous deposition.

6. The manufacture method of the touch panel according to claim 1, wherein in the fourth step, an ultraviolet light of wavelength 200 nm-450 nm is employed to implement the exposure process to the photoresistor.

7. The manufacture method of the touch panel according to claim 1, wherein in the fourth step, the exposure lasts with 20-180 seconds.

8. The manufacture method of the touch panel according to claim 1, wherein in the sixth step, the protective layer is a silicon nitride thin film or a silicon dioxide thin film.

9. A manufacture method of a touch panel, comprising:
    step 1, forming a black matrix on one side of a color filter substrate;
    wherein the black matrix is arranged to shield light leakage among sub pixels of different colors of the color filter substrate and the black matrix is positioned corresponding to a sensor pattern to be set to form gaps at portions of the black matrix corresponding to the sensor pattern to be set;
    step 2, deposing a conductive film on the other side of the color filter substrate such that the black matrix and the conductive film are respectively located on opposites sides of the color filter substrate;
    step 3, coating photoresistor on the conductive film;
    step 4, employing the black matrix formed in the first step as a mask to implement exposure process to the photoresistor formed in the third step from the one side of the color filter substrate formed with the black matrix and then implementing development process;
    step 5, implementing etching to the conductive film by utilizing the photoresistor remained after the development in the fourth step to obtain the sensor pattern to be set such that the sensor pattern and the black matrix are respectively located on opposite sides of the color filter substrate;
    step 6, implementing film formation on the color filter substrate and the sensor pattern to form a protective layer for accomplishing the manufacture of a touch panel sensor;
    wherein the black matrix comprises rows and columns, and the rows and the columns are orthogonally connected;
    wherein the gaps are set at positions where the rows and the columns are connected;
    wherein in the second step, the conductive film is an Indium Titanium Oxide thin film or a metal thin film;
    wherein in the second step, the conductive film is formed by magnetron sputtering or chemical vaporous deposition;
    wherein in the fourth step, an ultraviolet light of wavelength 200 nm-450 nm is employed to implement the exposure process to the photoresistor;
    wherein in the fourth step, the exposure lasts with 20-180 seconds;
    wherein in the sixth step, the protective layer is a silicon nitride thin film or a silicon dioxide thin film.

* * * * *